United States Patent
Fetler (10) Patent No.: US 6,366,872 B1
(45) Date of Patent: *Apr. 2, 2002

(54) DATA PREDICTION IN DSP METHODS FOR TRANSIENT SPECTROSCOPIES

(75) Inventor: Bayard K. Fetler, Belmont, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/220,412

(22) Filed: Dec. 23, 1998

(51) Int. Cl.$^7$ ............................. G06F 15/00; H03F 1/26
(52) U.S. Cl. ........................ 702/189; 702/124; 708/300
(58) Field of Search ..................... 702/66, 72, 75–77, 702/79, 80, 124–126, 183, 189, 190, 197; 708/300; 700/25, 39, 73, 74; 324/76.15, 76.24, 76.29, 76.35, 76.38, 76.58, 76.68

(56) References Cited

U.S. PATENT DOCUMENTS

| 4,312,050 A | * | 1/1982 | Lucas ........................... 367/44 |
| 4,780,675 A | * | 10/1988 | DeMeester et al. ......... 324/312 |
| 4,837,513 A | | 6/1989 | Yao .............................. 324/309 |
| 5,652,518 A | | 7/1997 | Wurl ........................... 324/322 |
| 5,867,410 A | * | 2/1999 | Smallcombe et al. ....... 708/300 |

FOREIGN PATENT DOCUMENTS

GB    2 303 53 A    2/1997

OTHER PUBLICATIONS

Article by Dominique Marion and Ad Bax, entitled "Baseline Correction of 2D FT NMR Spectra Using a Simple Linear Prediction Extrapolation of the Time–Domain Data," published in *Journal of Magnetic Resonance* in 1989, vol. 83, pp. 205–211.

Article by Henrik Gesmar and Per Christian Hansen, entitled "Fast Linear Prediction and Its Application to NMR Spectroscopy," published in *Journal of Magnetic Resonance*, Series A, in 1994, vol. 106, pp. 236–240.

Article by Barkhuusen et al., entitled "Retrieval of Frequencies, Amplitudes, Damping Factors, and Phases from Time–Domain Signals Using a Linear Least–Squares Procedure," published in *Journal of Magnetic Resonance* in 1985, vol. 61, pp. 465–481.

Article by Guang Zhu and Ad Bax, entitled "Improved Linear Prediction for Truncated Signals of Know Phase," published in *Journal of Magnetic Resonance* in 1990, vol. 90, pp. 405–410.

Article by Starcuk Jr. et al., entitled "First–Data–Point Problem and the Baseline Distortion in Fourier–Transform NMR Spectroscopy with Simultaneous Sampling", published in *Journal of Magnetic Resonance*, Series A108, pp. 177–188, (1994).

* cited by examiner

*Primary Examiner*—Marc S. Hoff
*Assistant Examiner*—Manuel L. Barbee
(74) *Attorney, Agent, or Firm*—Edward H. Berkowitz (57) ABSTRACT

Observation of transient phenomena in an oversampled regime is implemented with a digital filter pre-charged with a list of pseudodata obtained by prepending one or more pseudo datums to the oversampled data to constitute an effective data set wherein each pseudodatum is derived from the complex conjugate of a corresponding actual datum symmetrically disposed with respect to the time origin.

6 Claims, 11 Drawing Sheets

DATA PREDICTION IN DSP METHODS FOR TRANSIENT SPECTROSCOPIES

FIELD OF THE INVENTION

This invention is in the field of digital signal processing methods and particularly relates to digital signal processing of signals acquired in nuclear magnetic resonance (NMR) and like spectral measurements.

BACKGROUND OF THE INVENTION

Progressively higher resolution NMR measurement demands higher signal to noise performance and a baseline free of artifact and distortion. A known methodology for obtaining improved signal to noise performance involves the sampling of time domain waveforms at a rate in excess of twice the rate corresponding to the highest frequency component of interest in the waveform. This higher than required (oversampling) rate $\omega_s$ increases the spectral width proportionately and causes the uncorellated noise, or noise from broadband sources to be spread over a wider bandwidth. Only a relatively narrow portion of this expanded bandwidth contains the data of interest. Were the expanded bandwidth to be directly accommodated, the requirement for both memory and time for effecting the Fourier transformation would become impractical or prohibitive. Alternately, and preferably, the oversampled data is subject to a digital filter which returns a single datum from a plurality of oversampled data through convolution of the oversampled data with a selected filter function. Digital filter theory and practice are well known to the artisan.

In the prior art, the use of digital filters commonly introduces artifact and/or distortion to the spectral baseline. An origin for this effect is recognized in the time delays associated with filters which operate upon the time domain waveform. For example, a digital filter initially (at the physical time origin) lacks the requisite history of oversampled data upon which to operate. U.S. Pat. No. 5,652,518, commonly assigned and incorporated herein by reference, treats this initial lack of data by an initialization with use of pseudodata derived from the filter function coefficients to achieve a real-time digital filter exhibiting reduced baseline distortion.

It is known in the prior art to reduce baseline distortion arising from finite response time of filters and delays due to undesired transient instrumental response time through the precise alignment of pseudodata with a time origin. See U.S. Ser. No. 08/723,967, commonly assigned herewith.

It is also a common problem with transient time domain measurements, and particularly in the area of NMR, that the physical time origin is inaccessible for direct sampling. The transient excitation has a finite time width containing the physical time origin. Following the transient excitation, there is usually encountered an interval during which instrumental effects (finite width of the excitation and ringdown of the NMR probe, for example) preclude data acquisition. Thus there is an inaccessible sampling interval resulting in an incomplete data set for data referenced to a physical time origin. Incomplete data sets also occur where the data sampling of a transient waveform is terminated at some point in the waveform evolution leaving unacquired data associated with later times. It is common in such instances to complete the set with null data or resort to sophisticated computational techniques for extrapolation. This latter situation is not the subject of the present invention.

It is known in the prior art to augment an incomplete set of actual data for subsequent treatment, e.g., Fourier transformation, by inclusion of pseudodata points created according to some consistent prescription. Thus, it is a common practice to add a subset of null datums to the actual, but incomplete, data set, as indicated above. The Fourier transformation process is indifferent to the relative position of such data within the data set. Where it is desired to address the problem posed herein, the prior art '518 patent adds to the data set a subset of pseudodata for which the amplitude of each pseudodatum is prescribed by that digital filter function which is applied to oversampled data. In particular the pseudodata is added at abscissae corresponding to negative time displacements from the physical time origin. For a digital filter of discrete sampling length $N=2p+1$, there is desirably defined $p$ pseudodatums in this negative time interval. After the elapse of time corresponding to $p+1$ actual sampling intervals, the digital filter is fully operational to yield a downsampled datum. It is important to recognize that in practice there will be some small number of actual data absent from the oversampled data set in close proximity to the actual time origin, owing to the inaccessibility mentioned above. The number of missing samples and their ordinate values may be supplied by an appropriate procedure which ideally reflects the signal phase and amplitude conditions at $t=0$.

It is known to estimate pseudo data by methods of linear prediction (LP). These may be broadly described as applications of linear least square methods to actual data for extrapolation into a region where no data has been acquired, such as the above mentioned zone of inaccessibility. In general, LP is computationally intensive, and thus is not suitable for the real time application for which the present invention is preferred. For LP, a substantial number of consecutive actual datums is required to form an acceptable prediction of a pseudodatum by LP for the datum next adjacent to the actual data set. For example, in common practice 25 points may be required to obtain the value of the "next" predicted point through LP. In such instances, LP will require formation and inversion of matrices of dimensionality 25. Estimate of the next +1 pseudodatum will require similar treatment using a dataset which now includes the pseudodatum formed by the first prediction. Thus error and uncertainty accumulates in a subset of pseudodatums formed by LP methods. Validity of LP methods is established by boundary conditions which produce invariance of spectral parameters between actual data and values produced for such actual data by LP operations. One example of LP utilized in NMR is described by Marion and Bax, Journal of Magnetic Resonance, v. 83, pp. 205–211 (1989). Here, the data are reflected backwards in time for the purpose of obtaining a better estimate for points situated forward in time. These backward reflected pseudodata are then discarded. Other examples of LP are: Gesmar and Hansen, J. Mag. Res., v. A106, pp. 236–240(1994); Barkhuijsen, et al, J. Mag. Res., v. 61, pp.465–481.

SUMMARY OF THE INVENTION

In one aspect of the invention, prepending a plurality of pseudo datums to the earliest portion of an oversampled data set establishes a complete data set wherein the pseudodata is derived directly from actual data acquired proximate said pseudodata.

In another aspect of the invention, the actual acquired data is reflected in that time coordinate at which actual data is first available.

In yet another aspect of the invention actually acquired phase resolved data is reflected in that time coordinate at which actual data is first available by taking the complex conjugate of each actual datum and entering said complex conjugate multiplied by a phase factor at a time position symmetrically disposed about that time coordinate with respect to the actual datum.

In still another aspect, said complex conjugate formed pseudodata are multiplied by a selected weighting function g(t).

In another aspect of the invention, a digital filter is employed to reduce the oversampled data acquired at a sampling rate $\omega_s$ to downsampled data at sampling rate $\omega_s/M$.

In still another aspect of the invention, enough pseudodata is prepended to the list of actual data to extend beyond the earliest portion of actual data to a negative time displacement from the time origin by an amount equal to at least approximately ½ of the length of the digital filter.

BRIEF DESCRIPTION OF THE DRAWINGS

FIG. 8b shows the present invention applied as in FIG. 7a.

DETAILED DESCRIPTION OF THE INVENTION

Figure 1:
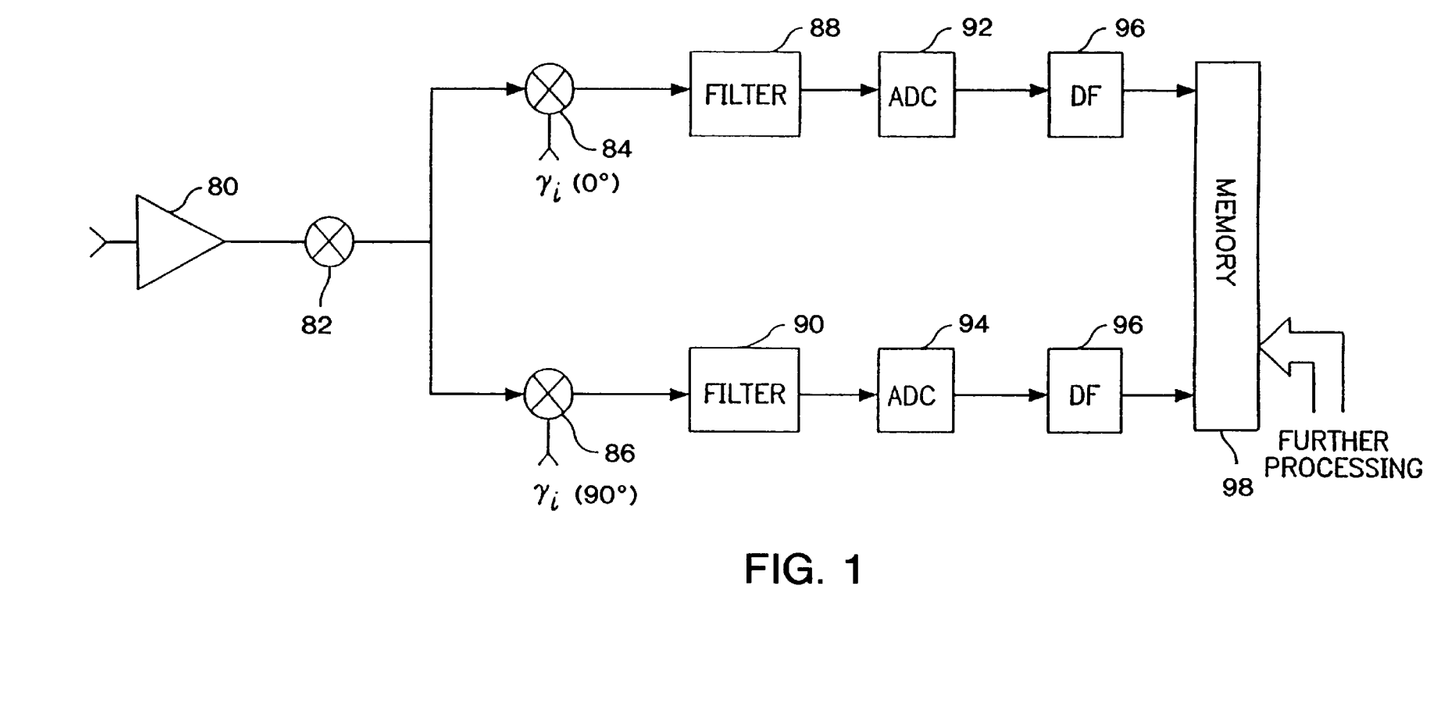
FIG. 1 is an illustration of the context of the invention.

FIG. 1 describes one particular instrumental context of the invention at the signal processing level close to the invention. An RF signal is derived from the NMR probe, which may include suitable pre-amplification, and is directed through amplifier 80 to mixer 82 where a local oscillator signal is mixed to yield a reduced intermediate frequency (IF) signal. The reduced frequency signal is split and directed in parallel paths to respective phase sensitive detectors 84 and 86 to yield respective quadrature related components. These signal components are subject to low pass filters 88 and 90 and then processed by respective ADCs 92 and 94. At this point, the digital filter 96, effectuated by a digital processor (not shown) operates upon each datum as it becomes available at the output of the component ADCs 92 and 94. The digital filter operates to transform oversampled data to downsampled data. Following the digital filter, the datum is recorded in memory 98 for subsequent time averaging and/or processing via the host computer, not shown. Logic apparatus, not shown, is employed to enable various components (such as ADCs 92 and 94, amplifier 80, etc.) at desired times. Although FIG. 1 illustrates an exemplary arrangement employing quadrature detection, the invention is not so limited.

Any filter has the potential property of producing a delay for the signal propagating therethrough. An analog filter may be regarded as implementing a corresponding delay line. In the prior art, digital filters also incur a charge-up, or initialization delay through the requirement of the acquisition of sufficient data to commence the processing of that data before the digital filter may emit its processed output. For the situation where oversampling is practiced, the low pass filters 88 and 90 are designed to pass the highest frequency in the range corresponding to the oversampling rate. For the purposes of this work, it is immaterial whether the filter function resides in the general receiver apparatus or in particular specific components. The phrase "analog filter" is here employed to distinguish the digital filter. This produces a bandwidth much broader than the narrow bandwidth of interest, which will result from operation of the digital filter. Delay is introduced principally by the analog filters 88 and 90. It will at once be apparent that the various delays of whatever source contribute to a phase shift with respect to coherent physical phenomena commencing with the excitation pulse. For the case of NMR, such pulse initiates a precession of nuclear spins. Observation is not usually possible during the interval physically concurrent with the pendency of the excitation pulse (for most transient spectroscopies). The acquisition of the data set is initiated after some selectable time interval, which may be characterized by the nature of the physical phenomena and also by instrumental parameters. The time interval is selectable within limits depending upon the filter delay(s) and other physical phenomena. In the particular case of coherent spectroscopies, if the data set commences with a datum which is delayed an integral multiple of the sampling period with respect to the center of the relevant excitation pulse there results a frequency dependent phase shift of $2\pi n$ (n, an integer). It is recognized that the choice n=0 is preferable, inasmuch as a frequency dependent phase shift of zero results.

An oversampled measurement of general transient phenomena assumes some receiver-filter-digital converter arrangement further including a digital filter ("receiver") for downsampling the oversampled data. In the general case, the receiver is necessarily inoperative for a time interval during which the excitation pulse is active in order to protect the receiver from overload. Real systems usually provide additional time for ringdown of circuits affected by the excitation pulse. Thus the receiver cannot become active until after some earliest time interval following excitation. The time interval after which oversampled data appears at the output of the analog filter includes propagation delay through all circuitry in the signal path, (principally due to the analog filter). This constitutes a minimum delay β. In the prior art, an executable selectable delay α is provided to add fine timing adjustment capability. It is convenient to effectuate this selectable interval as a delay (which is the sum of α+β) executed before issuing a conversion command to the ADC 92 or 94. This selectable time interval serves to produce an alignment of the downsampled data in respect to a time grid properly referenced to the physical time origin. This is the subject of the prior art Ser. No. 08/723,967, commonly assigned herewith. Thus, the physical time origin maps to a physically later time. This displacement represents propagation delay through circuits in the signal path. This time interval between the excitation and the first acquired data, ("data gap") is an important aspect of the central problem of complete data sets, time synchrony and the like. While the present invention is directed to digital filter precharge (the preparation of the digital filter for operation with the earliest acquired data), prediction for values of the signal within the data gap follows with the inventive choice of precharge disclosed herein.

Although an abstract physical time origin may be associated with a point very nearly midway through the excitation pulse, direct observations cannot be made as a practical matter at this time or during a brief interval thereafter, for NMR experiments in particular, as well as for common transient impulse phenomena. In general, time domain measurement of the value of the first point acquired in the time domain is recognized to affect the resulting transformed frequency distribution as a constant ordinate offset. Error in the measurement of this point is easily corrected. Error in the second and subsequent points of the data set will be manifest as higher moments of the transformed distribution. In accord with prior art, if the second and subsequent sampled points of the data set are timed to satisfy a synchronous relationship with a discrete time grid, typically through adjustment of delay α, the contributions of error in the first few data points (affecting the baseline of the spectra) will be reduced. The first data point would also fall on this grid at n=0 if conditions would permit the early initiation of the oversampling procedure. However, the first point to be downsampled often cannot be obtained from N oversampled points because the overriding need is to assure that the second and subsequent points are properly aligned on the time grid and as a consequence, the number of oversampled points associated with the first downsampled point is deficient. In the prior art it was discovered that the deficiency of some number of q oversampled points is successfully remedied by the addition to N−q measured points of q pseudo values to provide the weighting for a complete subset of N oversampled datums. In the present work, these pseudodata are selected in a particular manner to obtain frequency spectra which exhibit a more satisfactory baseline. These pseudo datums occur earlier than the time origin (a negative time displacement) for the actually acquired oversampled data and, in the present invention, are assigned values equal to the phase-rotated complex conjugate of the respective acquired (oversampled) data which are symmetrically disposed with respect to the initial acquired oversampled data.

Figure 2:
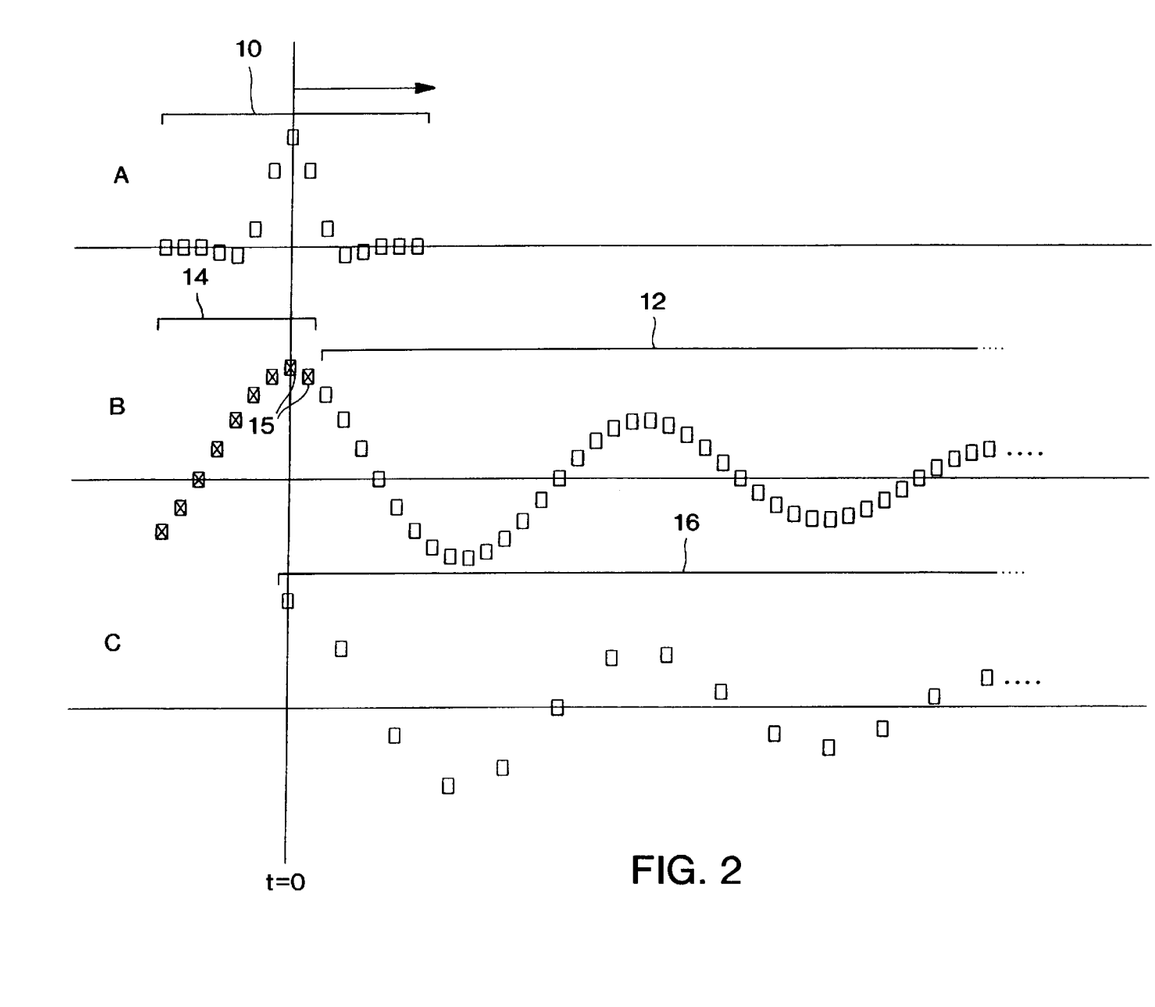
FIG. 2 is a conceptual illustration of the digital filter operation on oversampled data, where (a) is the filter function, (b) is oversampled real data including pseudodata and (c) is downsampled real data.

For convenience it is useful to review the nature of the operation of the digital filter on oversampled data to yield downsampled data. FIG. 2 shows a conceptual digital filter function 10 which is to be applied to actual oversampled data set 12 to which there is appended a pseudodata set. The digital filter operates upon the data sets 12 augmented by 14, multiplying each datum by the corresponding filter weight (point) and summing these products to emit the first downsampled datum 16 of the downsampled (phase resolved real component) data set 18 of FIG. 2c. The filter is then "displaced" along the abscissa, by a number of points equal to the oversampling factor, to operate again. This conceptual example illustrates a filter of 15 coefficients operating to downsample from an oversampling factor of 3. The pseudodata set 14 constitutes a precharge of the digital filter by which the filter commences operation on the first actual acquired datum in a manner which is not dissimilar from operation on data arbitrarily selected from the set 12. The datums 15 are disposed in that quiescent interval, or data gap, during which acquisition of actual data is foreclosed by instrumental and physical effects. The datums 15 in all respects are members of the pseudodata set 14 and in the preferred embodiment of the present invention these data are obtained in common with the generation of the other points of this set 14. The resulting downsampled data set 16 (only one channel is illustrated) is then available for Fourier transformation.

In the present invention, the precharge for the digital filter is realized by computing the complex conjugate of actually acquired, oversampled data. Any quantity defined on the complex plane has the property of phase, which must be properly treated. Moreover, a phase resolved quantity processed by actual hardware, is subject to the arbitrary phase origin for that hardware, e.g., the receiver phase.

Figure 3A:
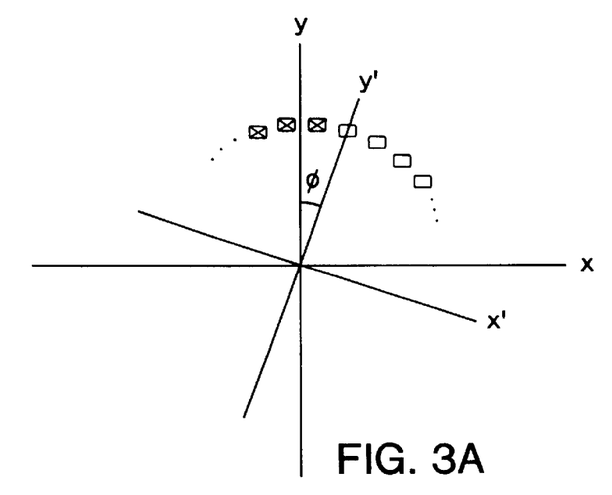
FIG. 3a illustrates a case of non-zero receiver phase for data acquisition.
Figure 3B:
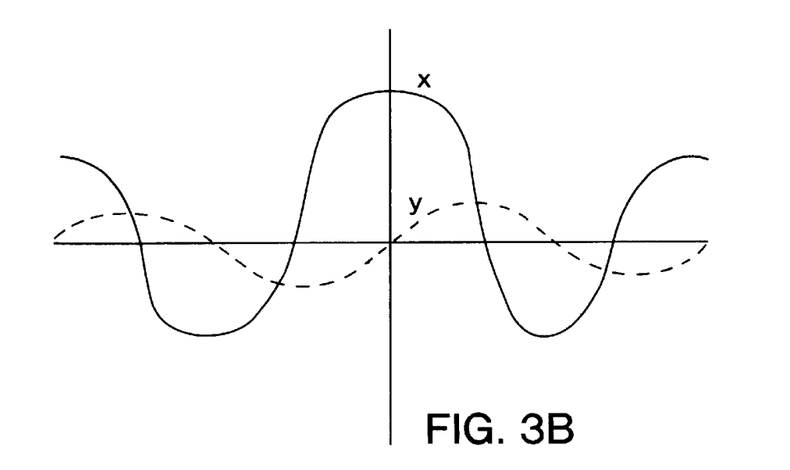
FIG. 3b shows behaviour of the complex data for zero receiver phase.
Figure 3C:
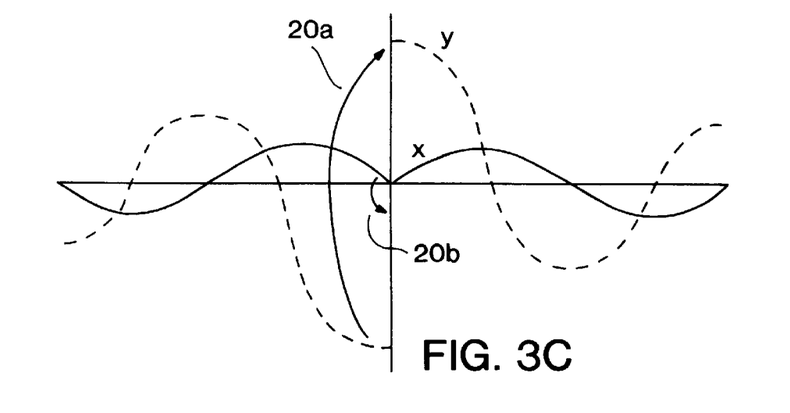
FIG. 3c shows the effect of 90° receiver phase.
Figure 4A:
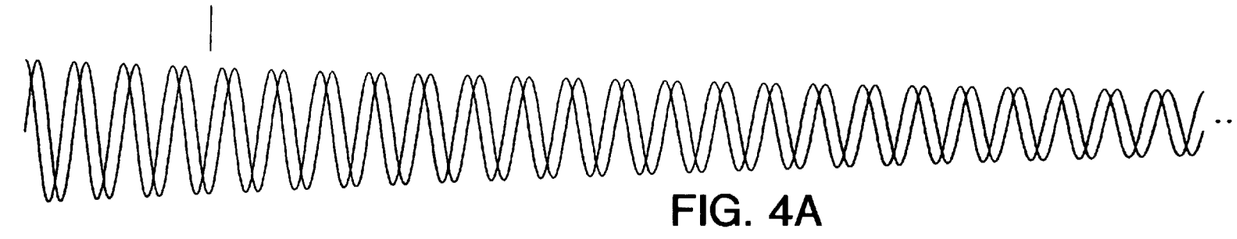
FIGS. 4a–d is a conceptual comparison of prior art and the present invention.
Figure 4B:
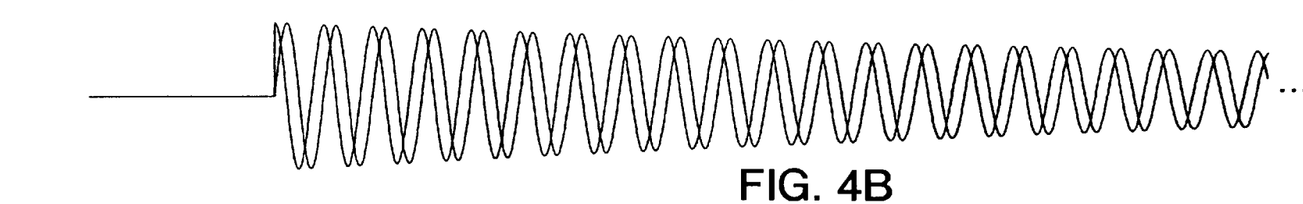
Figure 4C:
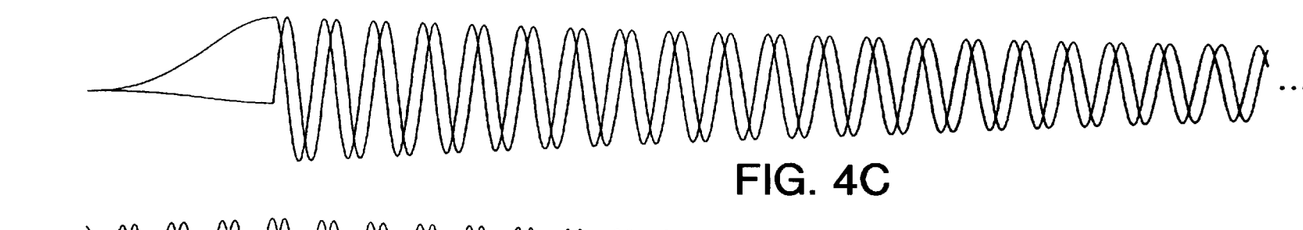
Figure 4D:
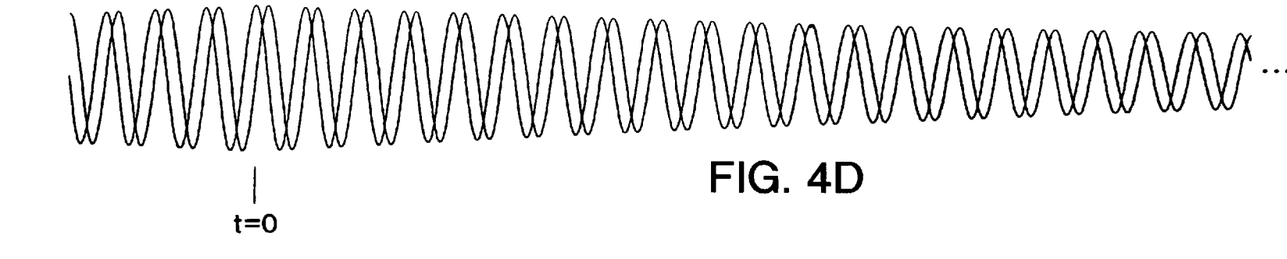
Figure 5A:
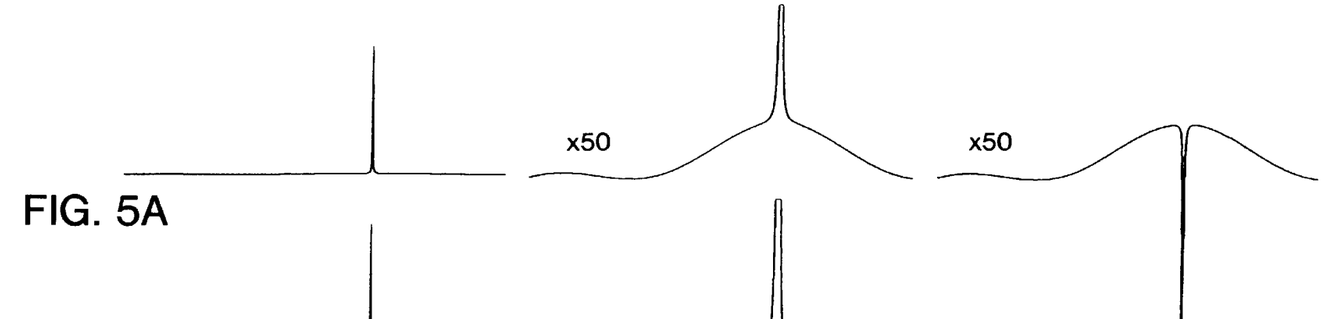
FIGS. 5a–d show the respective frequency domain representations for the waveforms of FIGS. 4a–d at full scales (left column), small scales (mid column) and as differences between the prior art and the invention (right column).
Figure 5B:
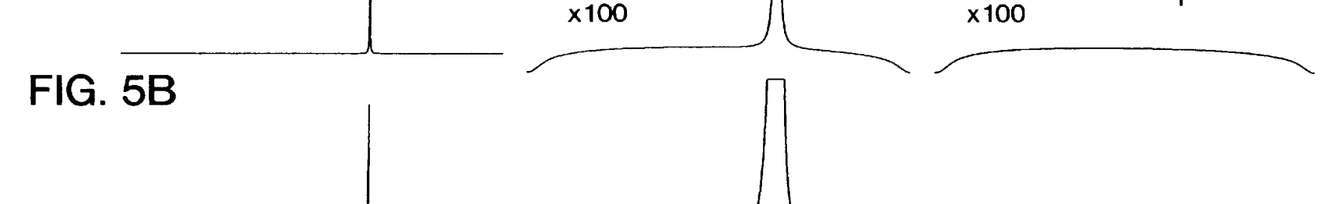
Figure 5C:
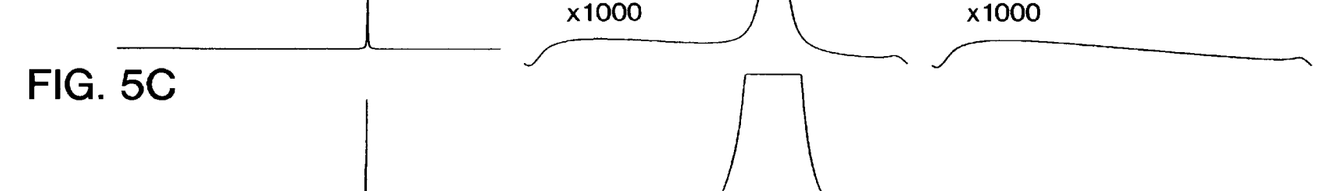
Figure 5D:
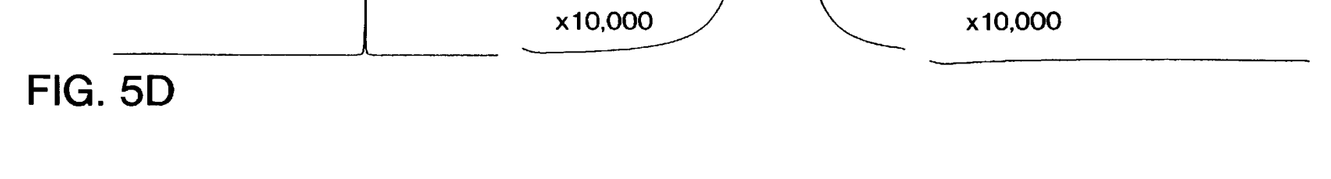

A brief resume of the present inventive method includes forming the complex conjugate of each of a set of first acquired actual phase resolved data. After complex conjugation, the pseudo datums are multiplied by a phase factor to correct for the overall receiver phase, which may be arbitrary. This may be regarded as satisfying a boundary condition that the acquired datums and the pseudo datums together constitute a digitized representation of a smooth, continuous function (especially with respect to NMR spectral parameters; composed of a sum of damped sinusoids). Essentially, if the receiver phase is zero, one can simply reflect the real acquired data into the real pseudodata, and reflect the negative of the imaginary acquired data into the imaginary pseudodata, which is a complex conjugation. The operation for non-zero receiver phase is readily appreciated with the aid of FIG. 3a where the actually acquired data are obtained in respect to a complex coordinate system x' y' rotated with respect to the hardware channel (complex ) coordinate system X Y. The acquired data values are first copied into the pseudodata in reverse order. The pseudodata with an associated receiver phase angle +φ is then corrected by an angle −φ obtaining a phase of zero. The complex conjugate is then taken, and multiplication by +φ restores the original receiver phase. This operation ensures that the receiver phase of the pseudodata and the receiver phase of the acquired data are the same across the boundary between the acquired data and the pseudodata, such that they together constitute a digitized representation of a smooth function. If the receiver phase is zero, as shown for the case of FIG. 3b, one can simply reflect the real (X) acquired data into the real (X) pseudodata and reflect the negative of the imaginary (−Y) into the imaginary (Y) of the pseudodata. Because the complex conjugation also negates the phase correction, these steps can be combined into a single operation whereby the complex conjugate of the acquired data is copied into the pseudodata, and then the phase of the pseudodata is corrected by an angle 2*φ. The correction contains a factor of 2 as is easily seen with the aid of FIG. 3c where the receiver phase is 90° and the correction is schematically indicated by rotation indicators 20a and 20b operating on respective channels of the complex data.

For typical data without early data point distortions the phase of the first acquired data point is a good approximation of the receiver phase.

The downsampling operation becomes as follows $p(n)=\exp(2i\phi)^* [x(n+1)]^{}$ n=1,2, . . . , (N−1)/2 {( represents complex conjugate}

$p_R(n)=\cos(2\phi)^* x_R(n+1)+\sin(2\phi)^* x_I(n+1)$ $p_I(n)=\sin(2\phi)^* x_R(n+1)-\cos(2\phi)^* x_I(n+1)$ $p(n)=p_R(n)+i^* p_I(n)$ $x(n)=x_R(n)+i^* x_I(n)$ This differs from prior art in that it is a complex-valued filter charge-up calculation. The two channels of the complex pseudodata each require the values of both of the two channels of the acquired data. The real part of the pseudodata $p_R$ depends on both the real ($x_R$) and imaginary ($x_I$) components of the acquired data points, and not only the real component, $x_R$ as with prior art. Similarly, the imaginary pseudodata $p_I$ also depends on both the real ($x_R$) and imaginary ($x_I$) components of acquired data, and not only the imaginary component $x_I$ as in prior art. The two components are mixed by the phase factor $2^*\phi$, which is a quantity inherent to the data. This is a dual channel chargeup calculation, unlike the prior art methods which operate only on a single channel, or treat each channel separately and independently. Thus, an extrapolation, backward in time from the earliest actually acquired data may be regarded as a reflection in the complex plane which provides an estimation of the missing physical datums and continues to extrapolate the reflection backwards in time, providing a precharge of the digital filter which has been found to yield a much improved spectral baseline.

The phase factor $\exp(2_i\phi)$ is determinable by any one of the following exemplary methods.

(i) Calculate the phase of the first data point, and use double the indicated phase as the phase factor. This calculation is particularly simple to perform on a DSP chip such as the TMS320C3x as employed here.

(ii) If the first data point is distorted, use the second or subsequent data point, and repeat (i). For example, the first data point may be determined to be distorted by taking the mean and the variance of several data points (points 2–6) and comparing whetherwith the value of the first data point differs from the mean by more than the variance.

(iii) Perform a curve fit or require a boundary condition on the data or its derivatives and extract the receiver phase from the curve fit, or use linear prediction methods or a filter calculation to obtain the correct phase from the first several data points.

(iv) Measure the receiver phase of the instrument from the hardware components, or from experiment.

One of ordinary skill in the art will recognize the above as well as other appropriate techniques for establishing the phase factor.

Under method (i) above, there are several procedures for calculating the phase factor from the first data point. One key point is that one only needs to know the values of $\cos(2^*\phi)$ and $\sin(2^*\phi)$ and not the phase angle $\phi$ itself, in terms of the first data point $(x_0,y_0)$ to perform the operation. One such procedure is the calculation of $\cos(2\phi)=(x_0^* x_0-y_0^* y_0)/(x_0^* x_0+y_0^* y_0)$ $\sin(2\phi)=(2^* x_0^* y_0)/(x_0^* x_0+y_0^* y_0)$ This procedure involves only one division operation to calculate the denominator in both terms, which takes 35 clock cycles using the standard method on a DSP chip such as the TMS320C3x. Other approximations to performing a division may also be used. Some of these alternatives are generally based on a Taylor series (polynomial) approximation to the inverse function (1/x) with different seed values.

One of skill in the art will appreciate that there are other methods for obtaining the first point phase, especially through the use of trigonometric calculations. These methods and their implementation through through use of lookup tables or approximations are well known and may be implemented directly on a DSP chip.

FIGS. 4a–d present a conceptual comparison of prior art data filling schemes with the present invention. These are the result of a theoretical single sinusoidal decaying signal for which the beginning portion of the time domain waveform is shown and is the equivalent of FIG. 2b. Curve a represents this signal with no pseudodata to constitute a precharge of the filter which must be idealized in the region proximate $t_0$ to neglect instrumental ringing and the finite width of the excitation (the data gap). Curve b represents a major delay which is attributable to the time required to acquire sufficient data to fill, or "charge" the digital filter, the propagation delay through analog filters, and instrumental ringdown and to obtain zero frequency dependent phase shift. As illustrated, the curve b corresponds to curve a but is shifted in time. Curve b is a specific example of zero-filling, wherein the data set is completed by assigning a value, (here, zero) to the inaccessible data. Curve c represents the specific approach employed in the aforesaid U.S. Pat. No. 5,652,518, wherein the data in a filter precharge region is derived from the coefficients of the digital filter. Finally, the present invention is represented by curve d, generated from the actually received data obtained at $t=t_0$ and thereafter, reflected in the pseudo-origin, $t_{0-}$. It is understood that the smooth curves depicted represent the locus of discrete samples of a time dependent signal, or waveform.

FIGS. 5a–d show the respective frequency domain representations for the above described theoretical single peak waveforms of FIGS. 4a–d after digital filtering and downsampling has been applied. These are the equivalent of the Fourier transform of dataset 18 in FIG. 2c. Full scale spectra is shown (left column), at vertically expanded scales (middle column) and as differences from a reference spectrum, the ideally expected downsampled signal (right column). The example shown is for a digital filter of 1001 coefficients and an oversample factor of 20 (brickwall filter), with a simulation frequency 30% to the right of center, within the downsampled spectral width. The edge of the filter bandwidth is essentially 10% beyond the downsampled spectral bandwidth, which results in baseline distortions from signal foldover within 10% of the edge of the downsampled spectrum.

Figure 6A:
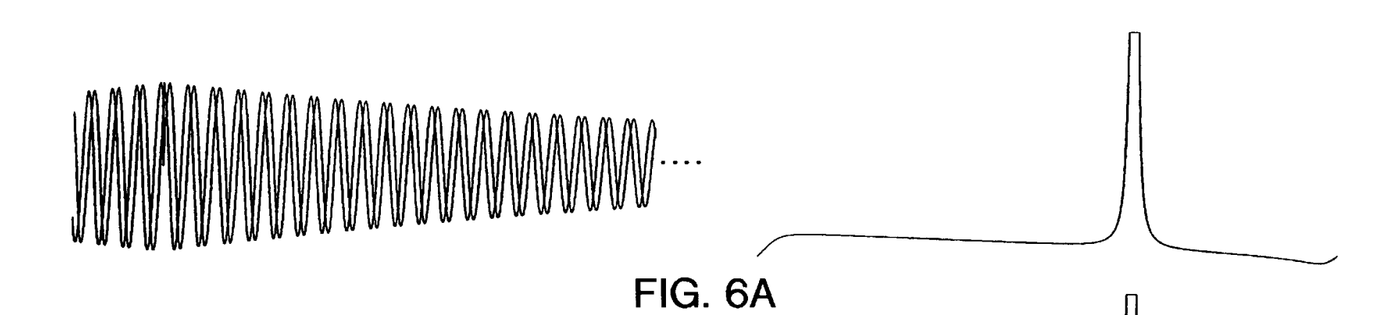
FIGS. 6a and 6b show the effect of using incorrect phase correction of the complex conjugates forming the pseudodata with the present invention.
Figure 6B:
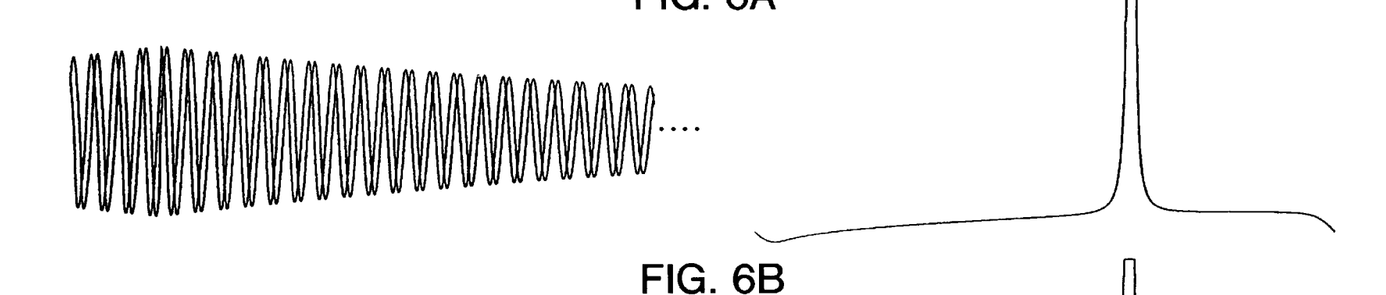
Figure 6C:
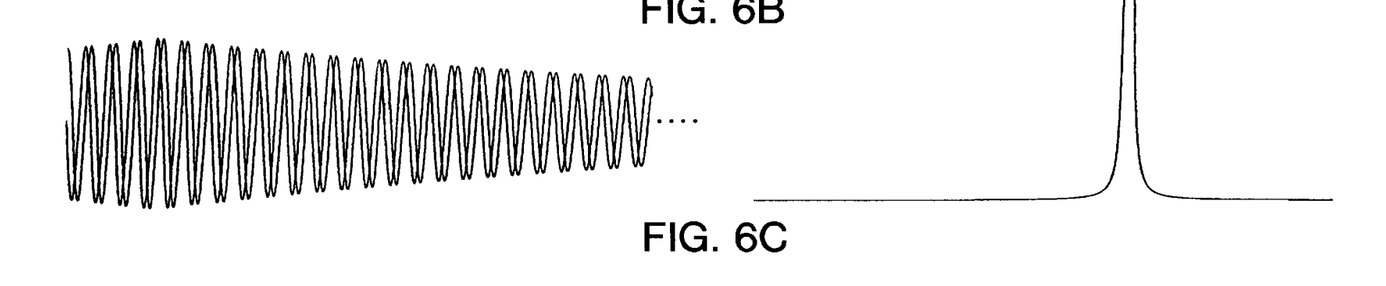
FIG. 6c is the same as FIGS. 5a and 5b for the correct phase multiplier.

FIGS. 6a–c present a conceptual comparison of using phase factor multiplication incorrect by +45° (top), by −45 (middle), and correct (bottom), after complex conjugation of the pseudodata, shown in the oversampled time domain (left column) and downsampled frequency domain (right column). The example shown is for a simulation frequency 30% to the right of center, using a brickwall digital filter of 1001 coefficients and an oversampling factor of 20.

Figure 7A:
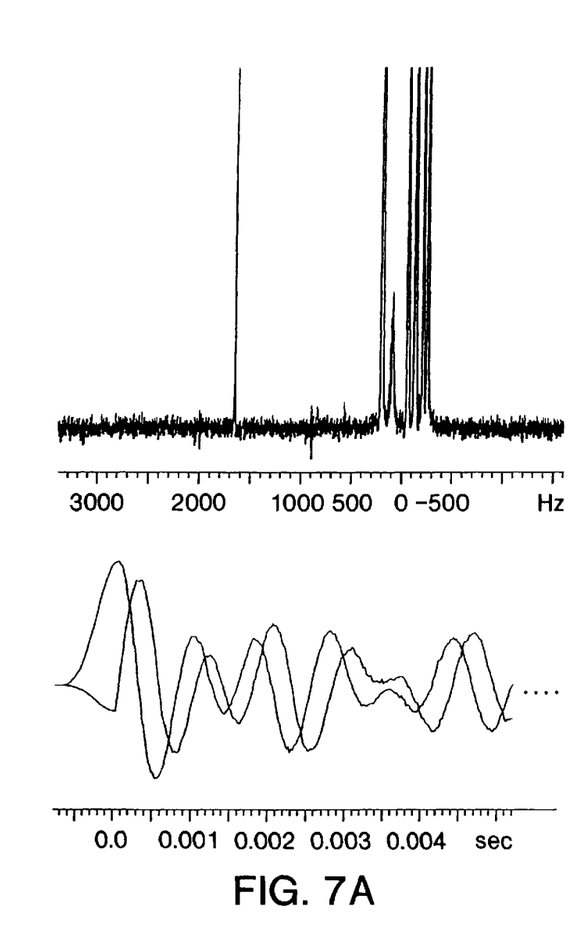
FIG. 7a is an illustration of an example spectrum of prior art using a filter defined from 75 coefficients for a sample of heptanone in deuterochloroform.
Figure 7B:
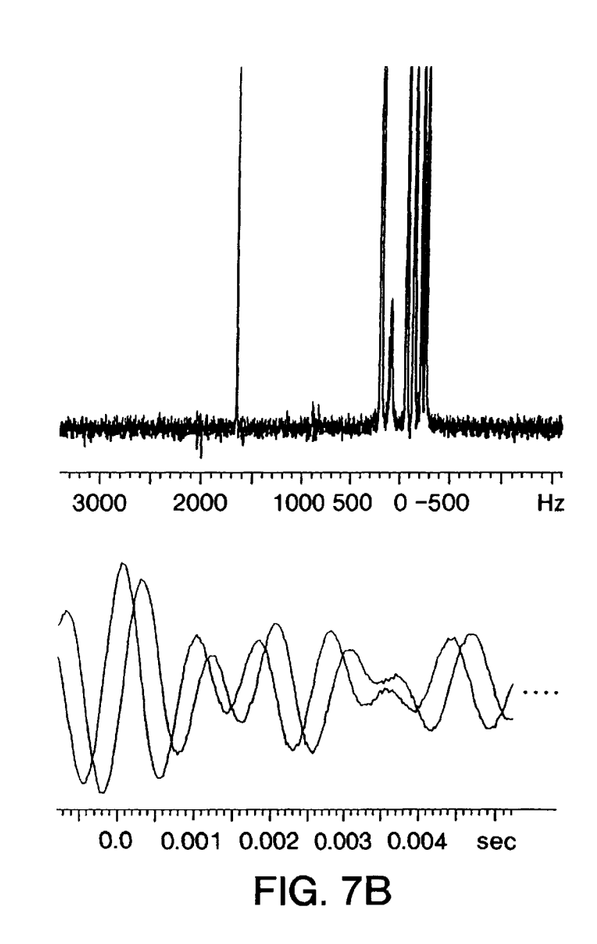
FIG. 7b is the same as FIG. 4a using the present invention.

The comparison of FIGS. 7a and 7b demonstrates the near identical baseline to be realized with either the '518 prior art or the present invention under the circumstance that all signals fall within the downsampled spectral width and the number of coefficients defining the charge-up curve of the prior art is not too large (here, 75 coefficients of a blackman filter) with oversampling factor of 10. The sample is a small organic molecule (1% heptanone in 99% deuterochloroform solution).

Figure 8A:
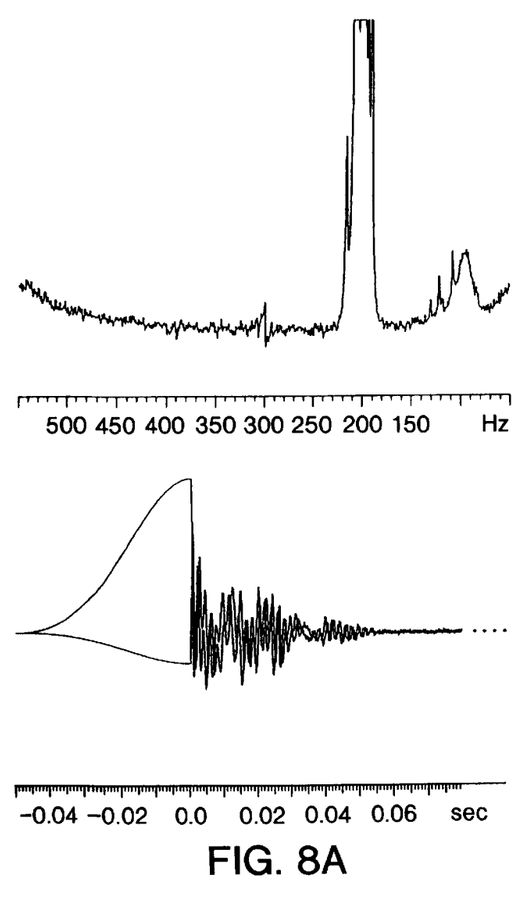
FIG. 8a shows the frequency spectrum and a portion of the time domain waveform using the prior art method for the sample of FIGS. 6a, b and a transmitter offset of 600 Hz.
Figure 8B:
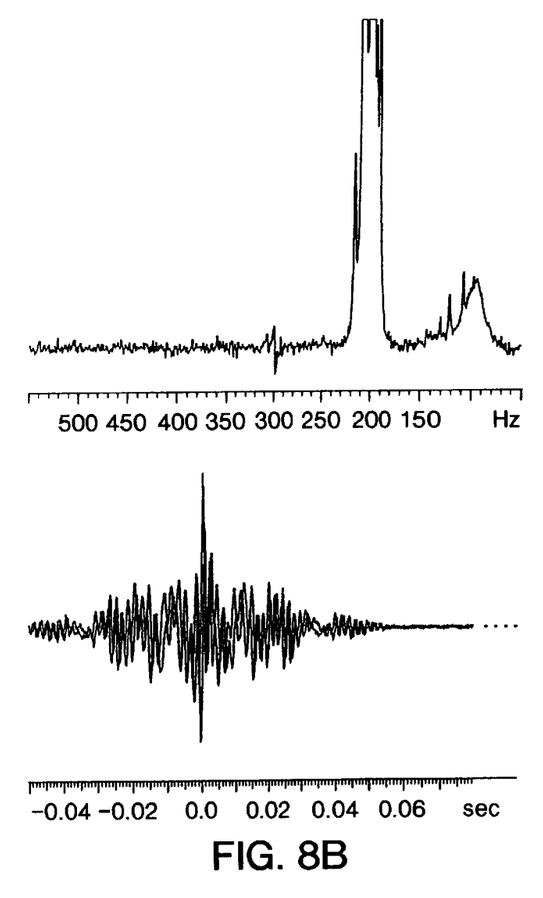

FIG. 8a (prior art) and FIG. 8b (present invention) are a detail, magnified from the same sample spectra as FIGS. 7a–b, oversampled by 20, but acquired using a "brick wall" filter, that is, a filter having a relatively steep discriminant characteristic defining the passband (blackman filter with 1001 coefficients). In both spectra, the transmitter frequency has been offset by 600 Hz to the right. A region of intense proton peaks, outside the downsampled spectral width, are located out of band between 0 and −500Hz. The embodiment yielding the spectra of FIG. 8b employ a simple phase rotated complex conjugation of the first p=500 actual data points. The data necessarily missing between the time origin and the first oversampled datum were represented by q=4 additional complex conjugated points. The baseline of FIG. 8b is substantially more uniform than the prior art (FIG. 8a).

Figure 9A:
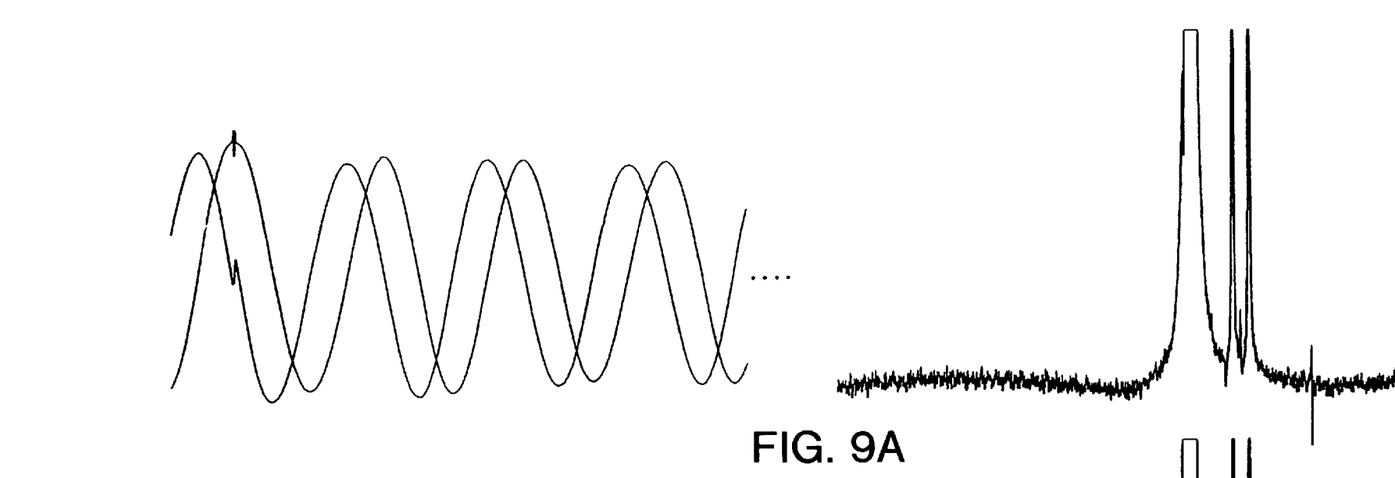
FIG. 9a shows the effect of an early data point distortion on the baseline for prior art.
Figure 9B:
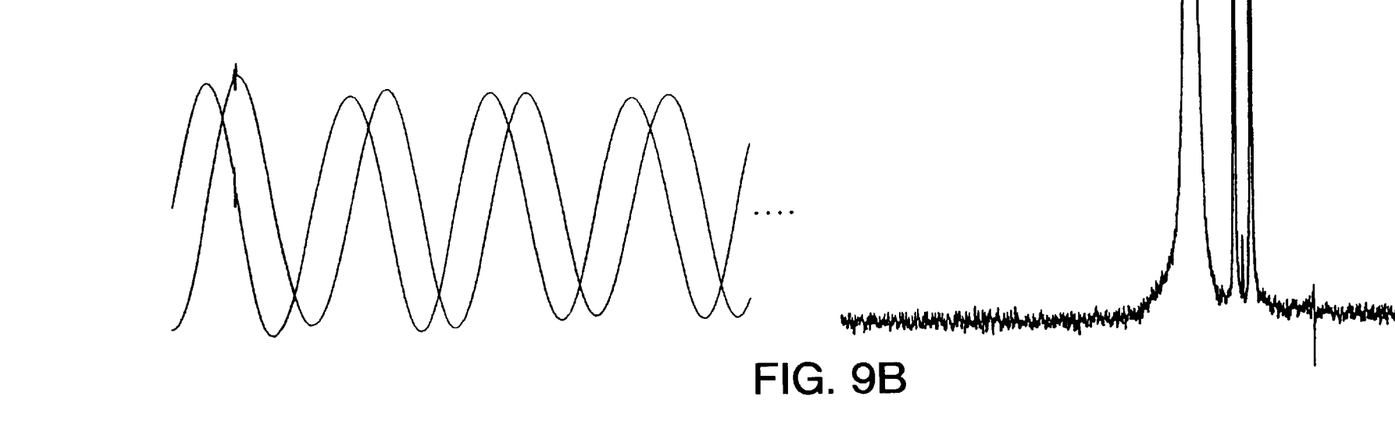
FIG. 9b shows the effect of an early data point distortion on the baseline for the invention.

FIGS. 9a–b show comparison of real spectra acquired with early data point distortion, using (top) present invention with first data point value in error by about 30% and the second data point value in error by about 10%. This may result from typical mis-settings of the receiver parameters. The lower curves present the invention with correct receiver phase factor calculated from a linear curve fit to the first several data points. Data is shown in the time domain prior to filtering and downsampling (left column) and frequency domain after filtering and downsampling (right column) representations. Spectra are of $0.1\%^{13}CH_3OD/1\%H_2O/99\%D_2O$ doped with$GdCl_3$; oversample factor =20 and number of filter coefficients=151.

It is readily apparent that the choice of pseudodata of either the present invention or prior art has influence on only a limited number of downsampled data points; after a certain point in time, the filter operates only on the acquired oversampled data and no longer includes any pseudodata.

It is well known that distortions in early time domain data points are a chief cause of baseline distortions in the frequency domain spectra. The number of affected downsampled time domain data points is approximately one-half the filter length divided by the oversample factor, p/M, which is dependent on the choice of filter; filters with sharp cut-off affect far more data points than do filters having a broad cut-off. The choice of pseudodata in the current invention has been found to produce smaller baseline distortions than other choices.

The choice of pseudodata of the present invention has the advantage that the frequency content of this pseudodata contains, by definition, an identical subset of spectral parameters (frequency components, amplitudes and phase) as occurs in the actual data. It is believed that the preservation of the frequency, amplitude and phase content of the signal as the signal is projected backward in time beyond the time origin largely accounts for the improved baseline of the present invention. Other attributes of a transient signal, such as transient decay constant, may also be considered as signal content for which pseudodata should preserve a close resemblance to actual data. The interval over which the distribution of frequency, amplitude, phase and decay affect the pseudodata is equal to p or ½ the length of the digital filter. If the decay is slow over this interval, the pseudodata signal content shows a close resemblance to the actual data.

In another embodiment of the current invention, one may choose to modulate the pseudodata by a digitized representation of an arbitrarily chosen weighting function g(t). Consider the choice of a function with an exponentialy rising shape equal to twice the exponential decay exhibited by the acquired data. The pseudodata without weighting exhibit an exponential decay. Multiplication by an exponential rise of the same time constant cancels the decay time constant and multiplication again by the same time constant yields an exponential rise such that the acquired data together with the pseudodata represent a digitized signal containing the correct time decay components. The time decay may be calculated in a variety of ways. Examples of such calculation are:

(i) from a curve fit to a number of acquired data points, (ii) from ordinary linear prediction methods, (iii) from linear prediction methods optimized to produce only time decay components, (iv) from iterative methods based on satisfying continuous boundary conditions between the pseudodata and acquired data, (v) or from estimating the value from a previous experiment.

It has been found from studies of a theoretical isolated resonance that a slight improvement in the baseline may be obtained, if the time decay is exactly preserved in the pseudodata.

Figure 10A:
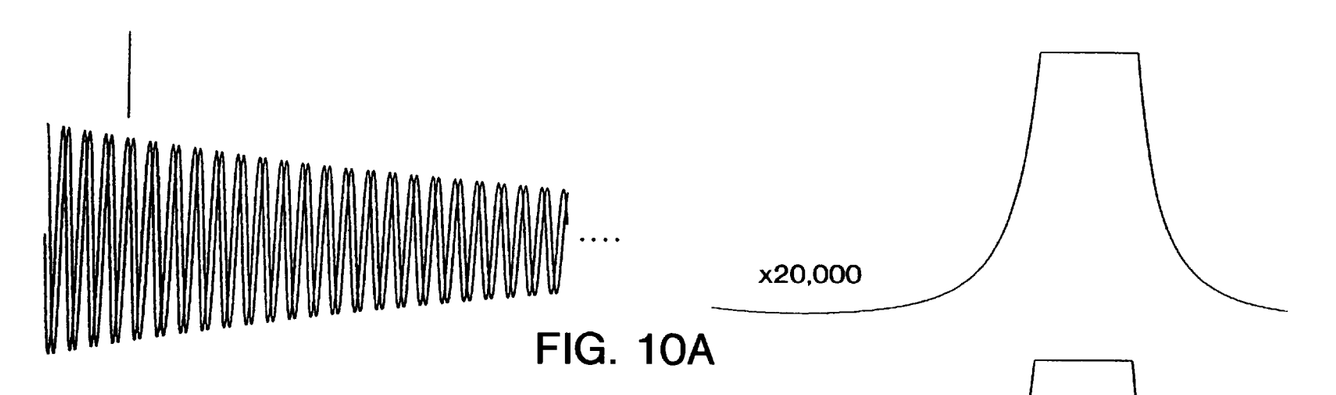
FIG. 10a shows a waveform with decay constant preserved in the pseudodata and corresponding spectral shape.
Figure 10B:
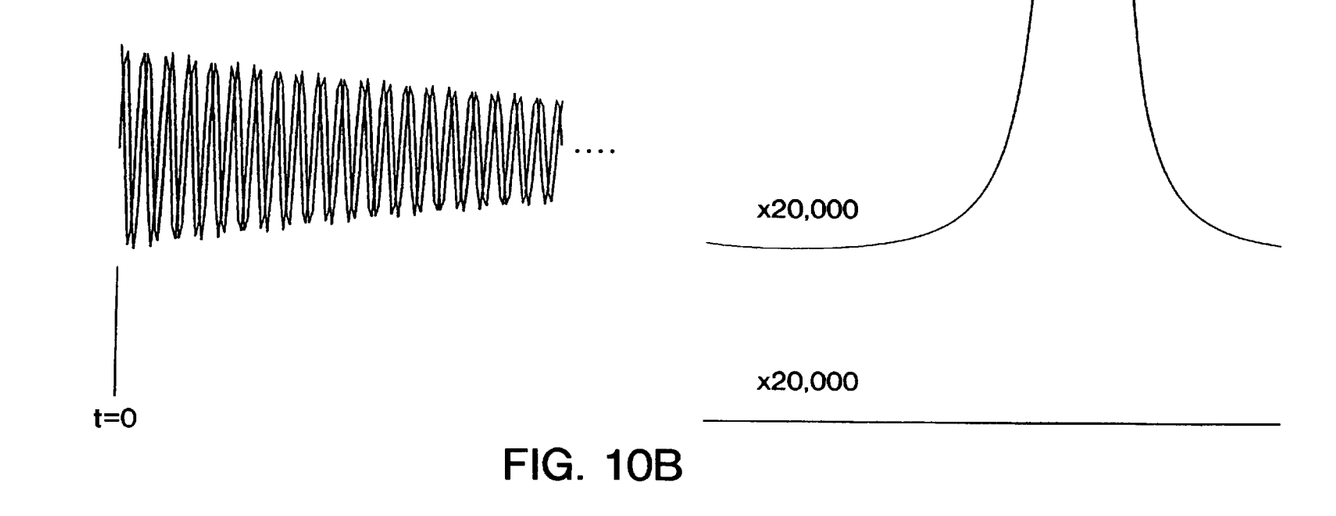
FIG. 10b shows the ideally downsampled waveform and corresponding spectral shape.

FIGS. 10a–b show a conceptual comparison of a weighted mode of a datafilling scheme of the current invention with the ideally expected result. Curve (a) represents the waveform complex conjugate pseudodata with a weighting function having twice the exponential decay value characterizing the actually acquired data. Curve (b) represents the ideally expected downsampled data after filtering. The respective frequency domain representations in the region of interest for the waveforms of FIGS. 10a–b appear at a vertically expanded scale to the right of the corresponding waveform. The difference between the invention and the ideally expected downsampled signal of FIG. 10b at bottom right is negligible at this scale.

Figure 11A:
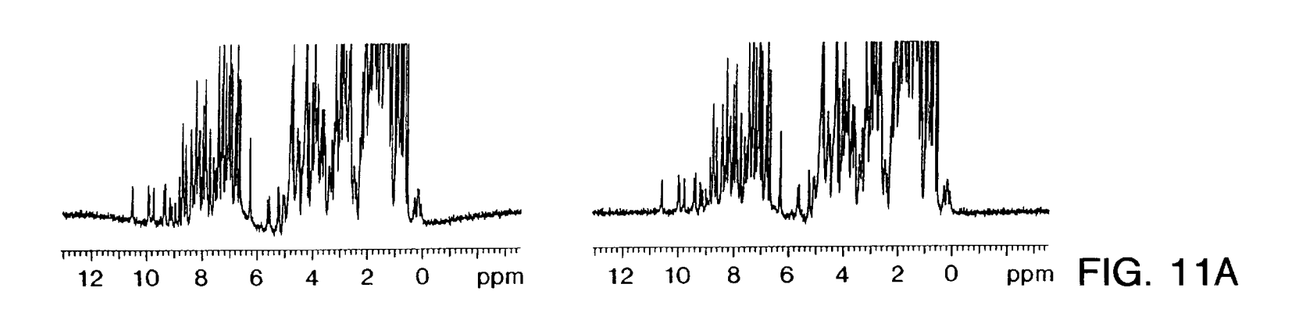
FIG. 11a compares prior art and the invention for receiver gated early.
Figure 11B:
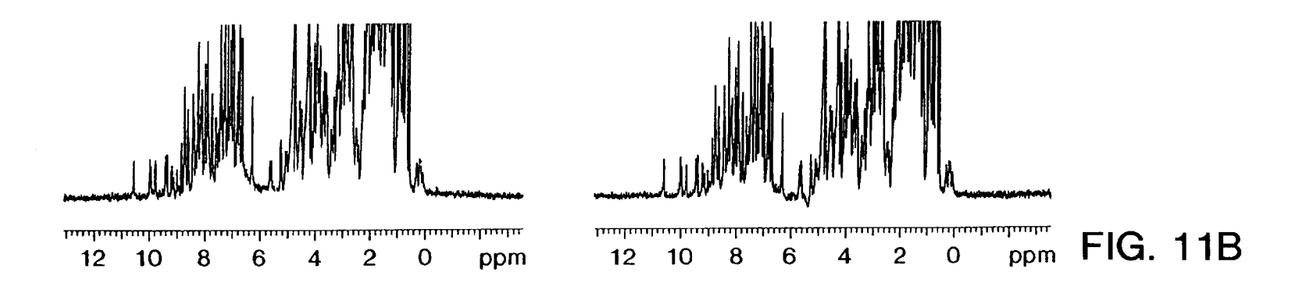
FIG. 11b compares prior art and the invention for receiver gated on time.
Figure 11C:
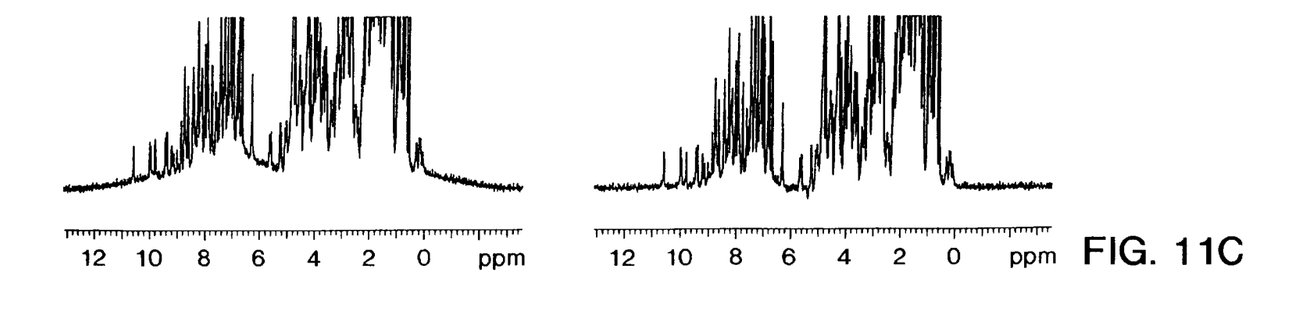
FIG. 11c compares prior art and the invention for receiver gated late.

FIGS. 11a–c show a comparison of baseline distortions in spectra, between prior art (left column) and the current invention (right column), due to receiver turn-on time being (a) early, (b) on time, and (c) late. The sample is 1 mM BPTI/95% $H_2O$/5% $D_2O$ acquired at 25 times oversampling with a filter of 187 coefficients. The baseline derived using the current invention (spectra forming the far left and far right portions of the respective figures) show little distortion, and is insensitive to change in receiver turn-on time as compared with the prior art as shown on the left for the corresponding condition.

Although the example of NMR data acquisition has been used, the invention disclosed herein is not limited to the field of NMR. Any digital filter downsampling operation for processing impulse data may profitably employ the invention.

It will be appreciated by those of ordinary skill having the benefit of this disclosure that the illustrative embodiments described above are capable of many variations without departing from the scope and spirit of the invention. Accordingly, the exclusive rights sought to be patented are as described below.

What is claimed is:

1. The method of establishing a processed data table of Lvalues derived from K<L oversampled quantities representing a phase resolved impulse response for subsequent transformation to the frequency domain, comprising, (a) exciting impulse phenomena at a time proximate $t_0$, (b) after a quiescent time $t_0+t_q=t_r$, directing a signal through a phase resolving receiver and analog filter apparatus to pass the frequency content of oversampled phase resolved data therethrough in the form of a complex waveform, (c) sampling said complex waveform to ADC apparatus at an oversampling rate $\omega_s$ to obtain first and subsequent samples, whereby each said sample experiences a delay in propagation through said receiver, analog filter and ADC apparatus, and whereby a list of said samples having ordinate values $A_1, A_2, A_3, \ldots A_K$ at respective discrete abscissa values are established at uniform intervals of $1/\omega_s$ commencing at $t_r$, (d) prepending to said list as many as p+q phase corrected pseudo datums at abscissa values $-(p+q)/\omega_s$ with respect to $t_r$, each said pseudo datum determined by a selected function corresponding to the complex conjugate of a respective actual datum, sampled at each of K actual datums commencing at $t_r$, said phase corrected pseudo datum ordinate being the result of multiplication of said complex conjugate by a phase correction factor selected to exhibit continuity of phase corrected pseudo data with said actual datums, (e) passing said oversampled data including said pseudo datums through a digital filter.

2. The method of claim 1 wherein said digital filter is of length 2p+1.

3. The method of claim 2 wherein the earliest L–K data in the interval $t_0$ to $t_r$ are unavailable.

4. The method of claim 1 wherein said pseudo data is modulated by a selected weight function prior to passage through said digital filter.

5. The method of claim 4 wherein said weight function is proportional to $1/g^2(t)$ where g(t) represents a function of the time dependence of a portion of the envelope of said actually measured data.

6. The method of claim 5 wherein said interval begins at $t_r$ and extends for a time (p+q) $\omega_s$.

* * * * *